United States Patent [19]
Herberg

[11] Patent Number: 4,581,543
[45] Date of Patent: Apr. 8, 1986

[54] SEMICONDUCTOR SWITCH HAVING A DISCONNECTIBLE THYRISTOR

[75] Inventor: Helmut Herberg, Munich, Fed. Rep. of Germany

[73] Assignee: Siemens Aktiengesellschaft, Berlin & Munich, Fed. Rep. of Germany

[21] Appl. No.: 495,640

[22] Filed: May 18, 1983

[30] Foreign Application Priority Data

Aug. 18, 1982 [DE] Fed. Rep. of Germany ....... 3230741

[51] Int. Cl.$^4$ ........................................... H03K 17/72
[52] U.S. Cl. ................,..................... 307/252 R; 307/252 C;
307/252 M; 307/305; 357/23.4; 357/38
[58] Field of Search ........... 307/252 R, 252 A, 252 C, 307/252 M, 305; 357/23 VD, 38, 23.4

[56] References Cited

U.S. PATENT DOCUMENTS

| | | | |
|---|---|---|---|
| 3,614,474 | 10/1971 | Hahn | 307/252 C |
| 4,224,634 | 9/1980 | Svedberg | 307/252 C |
| 4,284,911 | 8/1981 | McKeon | 307/252 C |

OTHER PUBLICATIONS

F. J. Burgum, "Basic GTO Drive Circuits", Philips Technical Publication 029, Electronic Components and Applications, vol. 3, No. 4, Aug. 1981, pp. 232–237.

Primary Examiner—John Zazworsky
Attorney, Agent, or Firm—Hill, Van Santen, Steadman & Simpson

[57] ABSTRACT

A semiconductor switch has a disconnectible thyristor, a first switching transistor connected to a lead of the thyristor and a turn-off current path which emits a control electrode of the thyristor to a terminal of the lead. Given such semiconductor switches, the critical voltage rise rate dU/dt is increased for an inhibit voltage up to which an undesired ignition of the thyristor is reliably avoided. This is achieved by providing a second switching transistor having its switching path connected in the turn-off current path. Both switching transistors are conductive in the inhibiting condition of the thyristor and form a stabilizing emitter-base short.

7 Claims, 3 Drawing Figures

SEMICONDUCTOR SWITCH HAVING A DISCONNECTIBLE THYRISTOR

BACKGROUND OF THE INVENTION

1. Field of the Invention

The present invention relates to a semiconductor switch, and more particularly to a semiconductor switch having a disconnectible thyristor, in which a first switching transistor whose switching path is connected into the lead of the thyristor is provided, and having a turn-off current path which connects a control electrode of the thyristor to a terminal of a lead at that side of the first switching transistor which faces away from the thyristor, and to a method for operating the same.

2. Description of the Prior Art

A semiconductor switch of the type generally set forth above is known from the Philips Technical Publication 029, "Electronic Components and Applications", Vol. 3, No. 4, August 1981, pp. 232-237, particularly with reference to FIG. 2. The switching transistor is connected in the cathode lead of the thyristor and is designed as a metal-oxide-semiconductor field effect transistor (MOS-FET) over whose gate the semiconductor switch is controlled. A capacitor is connected in the turn-off current path. The capacitor is charged with a voltage which prepares the thyristor, conditioned in its inhibited condition, for ignition. When the previously-inhibited switching transistor is placed in its conductive condition, an ignition circuit containing a capacitor closes and the thyristor is triggered. Given disconnection of the control voltage from the gate of the switching transistor, the same is blocked, whereupon the load current of the thyristor is entirely conducted into the turn-off current path, namely, until the capacitor and a further capacitor connected in parallel over a diode are charged to the voltage. The thyristor is thereby quenched.

SUMMARY OF THE INVENTION

The object of the invention, therefore, is to increase the stability of a semiconductor switch of the type mentioned above insofar as possible, i.e. to increase its reliability against unintentional triggering of the thyristor with application of a voltage polarizing the thyristor in the forward conducting direction.

The above object is achieved, according to the invention, by providing a second switching transistor which has its switching path connected into the turn-off current path.

The advantage attainable with a circuit constructed in accordance with the present invention is, in particular, that the second switching transistor fully maintains the function of the turn-off current path, on the one hand, and, on the other hand, represents an emitter-base short in the inhibited condition of the thyristor in that it is conductive at the same time as the first switching transistor. As a result thereof, the critical voltage rise rate dU/dt up to which an undesired ignition of the thyristor by a voltage U polarizing the thyristor in the forward conducting direction is reliably avoided, is very significantly increased in comparison to the known semiconductor switches of this type.

BRIEF DESCRIPTION OF THE DRAWINGS

Other objects, features and advantages of the invention, its organization, construction and operation will be best understood from the following detailed description, taken in conjunction with the accompanying drawings, on which.

DESCRIPTION OF THE PREFERRED EMBODIMENTS

Figure 1:
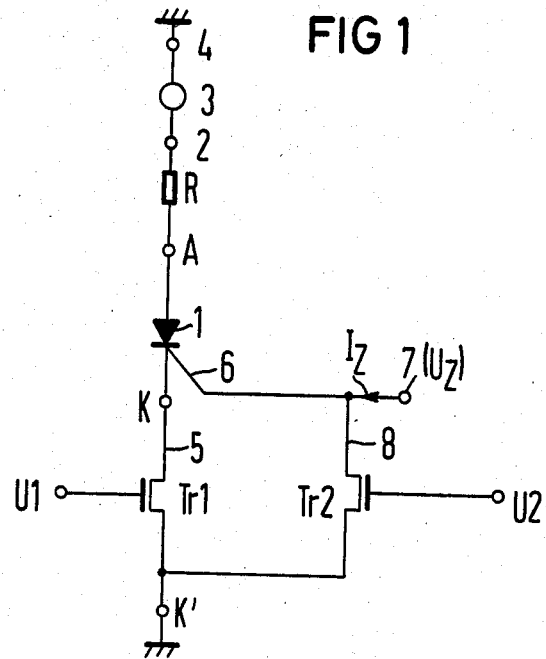
FIG. 1 is a schematic circuit diagram of a first exemplary embodiment of the invention.

Referring to FIG. 1, a semiconductor switch is illustrated with a disconnectible thyristor 1 which is also referred to as a gate turn-off (GTO) thyristor. Over its anode terminal A a load resistor R is connected to a terminal 2 of a voltage source 3 whose other terminal 4 is connected to ground potential. The cathode terminal K of the thyristor is connected to a terminal K', also a ground potential, by way of the cathode lead 5 of the switching path of a first switching transistor Tr1. The control electrode of the thyristor 1 is connected by way of a line 6 to a terminal 7 of an ignition circuit to which an ignition voltage $U_Z$ is supplied. Together with a further line 8, the control electrode of the thyristor 1 is connected to the point K' by way of a turn-off current path including a second switching transistor Tr2.

The transistor Tr1 and Tr2 are advantageously designed as metal-insulator-semiconductor (MIS) field effect switching transistors. MIS semiconductor structures are semiconductor structures which respectively comprise an electrode, particularly metallic, and electrically insulating layer and a semiconductor body. The transistor Tr1 is connected with a control voltage U1 supplied to its gate and the transistor Tr2 is connected with a control voltage U2, also supplied to its gate.

Figure 2:
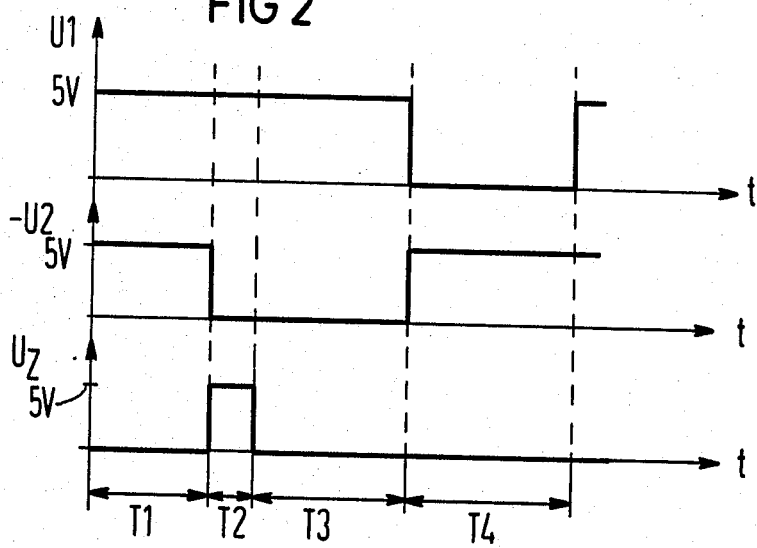
FIG. 2 is a series of voltage/time diagrams for explaining the operation of the circuit of FIG. 1.

FIG. 2 illustrates the time dependencies of the voltages which are expediently employed for operating the semiconductor switch illustrated in FIG. 1. The thyristor 1 is in its inhibited condition during a first time interval T1. The control voltage U1, which amounts to approximately 5 V, is applied to the gate of the switching transistor Tr1 so that the same is rendered conductive. At the same time, the voltage U2 is applied to the gate of the switching transistor Tr2, at a level of approximately 5 V. A conductive connection between the control electrode of the thyristor 1 and the point K' exists over the transistor Tr2. This connection forms an emitter-base short between the p base contacted by the control electrode and the n emitter contacted by the cathode electrode by way of which the pn junction between the semiconductor regions is bridged in a low-resistance manner. It is thereby guaranteed that the voltage U supplied by the voltage source 3 and applied at the points A and K and polarizes the thyristor 1 in the forward-conducting direction, cannot produce an unintentional ignition of the thyristor, even when high voltage rise rates dU/dt are achieved. The voltage U2 is switched off at the time interval T2 so that the transistor Tr2 becomes blocked and supplies a pulse-shaped ignition voltage $U_Z$ to the terminal 7 which effects an ignition current pulse $I_Z$ which flows to the terminal K' over the line 6, the control electrode of the thyristor 1, the terminal K and the transistor Tr1. The thyristor 1 is thereby triggered and is subsequently conditioned to its current-conductive state (time interval T3). The switching transistor Tr2 blocks during the interval T3, whereas the transistor Tr1 is conductive. The transistor Tr1 is blocked and the transistor Tr2 is switched into its conductive condition for turning off the thyristor (time interval T4). Therefore, the entire load current flowing through the thyristor 1 is rerouted into the turn-off current path 6, 8, Tr2, K' so that the thyristor is quickly quenched. Since only a current charging the gate capacitance of the transistor Tr2 is required for turn-off, this being very small in comparison to the load current to be shut off, the turn-off amplification, which is to be understood as the quotient of the latter and the former, is very large and can assume values of over 100. The time interval T4 is followed in FIG. 2 by a further phase in which the switching transistor Tr1 is again conductive and the thyristor 1 is inhibited.

Figure 3:
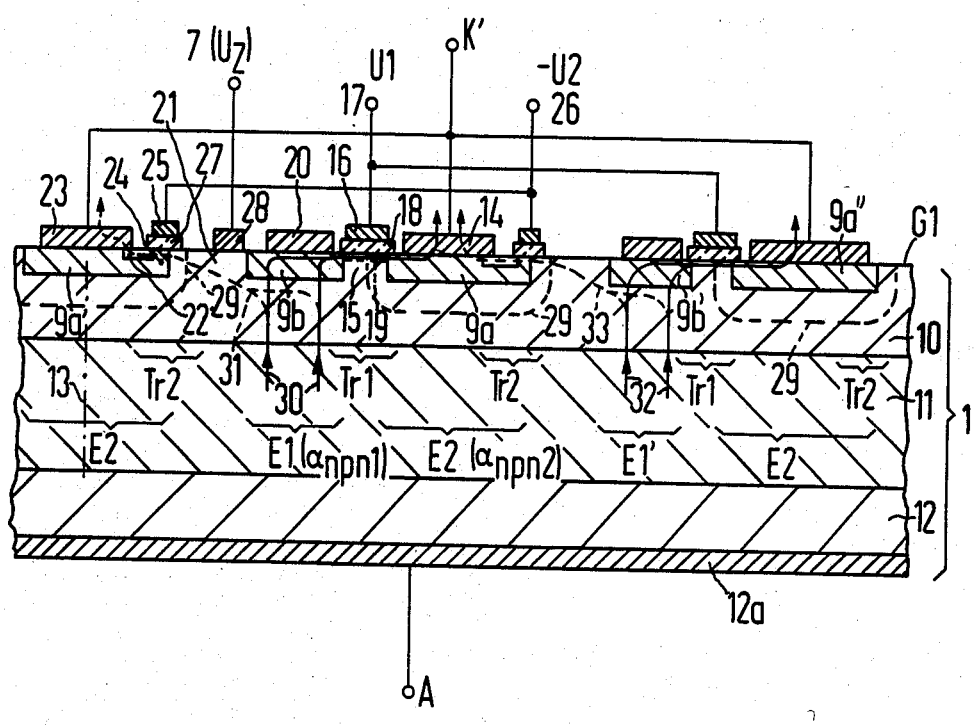
FIG. 3 is an enlarged fragmentary sectional view of a second exemplary embodiment of the invention constructed in accordance with integrated circuit technology.

FIG. 3 illustrates, in a fragmentary cross-sectional view, a semiconductor switch constructed in accordance with the present invention which is executed in accordance with integrated circuit technology. Identical reference characters in FIGS. 1–3 thereby refer to the same circuit parts or elements and voltages. As can be seen from FIG. 3, the thyristor 1 comprises a multilayer body of doped semiconductor material, for example, silicon having an npnp layer sequence. The uppermost n-conductive layer 9a, 9a', 9b, 9b' is referred to as the n emitter, the adjacent p-conductive layer 10 is referred to as the p base, the n-conductive layer 11 is referred to as the n base and the lowest, p-conductive layer 12 is referred to as the p emitter. The n emitter comprises a plurality of strip-like portions 9a, 9a', 9a'', 9b, 9b' which extend up to the boundary surface G1 of the semiconductor body and extend therein as, for example, straight elongate strip structures perpendicular to the plane of the drawing of FIG. 3. In other embodiments, they can also extend within the boundary surface G1 on the basis of an arbitrary curve, for example, spirals or the like, or, in particular, can exhibit a circular or, respectively, annular shape. The latter can be illustrated on the basis of FIG. 3 when the axis 13 is interpreted as an axis of symmetry with respect to the elements 9a, 9a', 9a'', 9b and 9b' being disposed rotationally-symmetrical relative thereto.

The element 9a of the n emitter is contacted by a cathode electrode 14 which is provided with a terminal K'. The element 9b of the n emitter is disposed next to the left-hand edge of the element 9a such that a zone 15 of the p base 10 lies between the elements 9a and 9b, the zone 15 extending up to the boundary surface G1. The zone 15 is covered by a gate 16 which is provided with a terminal 17 and which is separated from the boundary surface G1 by a thin insulating layer 18. The edge regions of the elements 9a, 9b adjacent to the zone 15 represent the n conductive source and drain regions of an n-channel MIS-FET whose p-conductive channel zone is formed by the zone 15. When a control voltage U1 is supplied to the gate 16, an inversion channel 19 is formed at the boundary surface G1, the inversion channel connecting the elements 9a and 9b to one another in a low-resistance manner. When the voltage U1 is disconnected from the gate 16, the inversion channel 19 and, thus, the low-resistance connection between the elements 9a and 9b are eliminated. The element 9b of the n emitter is advantageously provided with an electrode 20 which exhibits no external terminal but, rather, represents a means for compensating the potential differences within the element 9b in the region of the boundary surface G1. The element 9a' of the n emitter is located in the p base 10 to the left next to the element 9b such that a zone 21 of the p base lies therebetween. A p-conductive region 22 is located therein in the area of the right-hand edge of the element 9a', the region 22 extending up to the boundary surface G1 and being contacted thereat by a cathode electrode 23 which also contacts the element 9a'. The electrode 23 is connected to the terminal K'. The semiconductor region 22 and the zone 21 represent the p-conductive source and drain regions of a p channel MIS-FET whose channel region comprises the edge area 24 of the element 9a' lying between the zones 21 and 22, whereby the edge area 24 is covered by a gate 25 which is provided with a terminal 26 and is separated from the boundary surface G1 by an electrically insulating layer 27. When the negative control voltage $-U2$ is supplied to the terminal 26, an inversion channel connecting the zones 21 and 22 or, respectively, the zone 21 and the terminal K', to one another in a low-resistance manner is formed at the boundary surface G1 below the electrode 25, the inversion channel, in turn, being eliminated when the voltage $-U2$ is turned off.

A control electrode 28 of the thyristor contacts the p base 10 and is provided with a terminal 7 (see FIG. 1) to which the ignition voltage $U_Z$ is supplied. The p emitter 12 is likewise provided with an anode electrode 12a which exhibits a terminal A.

The n-emitter elements 9a, 9a' and 9a'' are surrounded by sub-regions 29 of the p base 10 which exhibit an additional p doping so that the degree of doping is higher than the remaining portions of the p base 10. Because of the sub-region 29 which surrounds the element 9a, the three-layer structure comprising the elements 9a, 10 and 11 has a current gain factor $\alpha_{npn2}$ relative to the electrons emitted by the n-emitter element 9a in the case where a voltage polarized in the forward conducting direction of the thyristor is applied to the terminals A and K', the current gain factor being smaller than the corresponding current gain factor $\alpha_{npn1}$ of the three-layer structure 9b, 10 and 11 relative to the electrons emitted by the n-emitter element 9b under conditions which are otherwise the same. It is therefore achieved, with the assistance of the sub-region 29, that after ignition of the thyristor, which is initiated by the pulse-shaped, positive ignition volage $U_Z$ at the terminal 7 of the control electrode 28, the load current proceeds from the p emitter 12 to the n-emitter element 9b insofar as the inversion channel 19 exists. By contrast, no current flows from the emitter 12 to the n-emitter element 9a because of the smaller current gain factor $\alpha_{npn2}$.

When the n-emitter element 9b is referred to as an emitter E1 and the n-emitter elements 9a and 9a' are respectively referred to as an emitter E2, then, therefore, the load current or, respectively, a portion of the load current as indicated by the solid-line current paths 30 flows from the p-emitter 12 to the emitter E1 and, over the inversion channel 19, to the emitter E2 lying to the right thereof and further flows over the electrode 14 to the terminal K'. When, however, the inversion channel 19 is suppressed and the inversion channel below the gate 25 becomes effective, then the load current or, respectively, load current component 30 is conducted forward as a turn-off current 31 (broken lines), in particular no longer by way of the emitter E1 but, rather, by way of the zone 21, the left emitter E2, the region 22, and the electrode 23 to the terminal K'. It proceeds therefrom that the FET comprising the elements 9a, 9b and 15-19 entirely corresponds to the switching transistor Tr1 of FIG. 1, whereas the FET comprising the elements 21, 22, 9a' and 24-27 essentially corresponds to the switching transistor Tr2 of FIG. 1, whereby only the negative operational sign of the control voltage −U2 to be supplied to the terminal 26 is to be considered a difference. The load current path A, K, 5, Tr1, K' of FIG. 1 corresponds to the current path A, E1, 19, E2, 14 and K' of FIG. 3, whereas the turn-off current path 6, 8, Tr2 and K' of FIG. 1 corresponds to the current path 21, E2, 22, 23 and K' of FIG. 3.

The load current or, respectively, load current component of the thyristor directed to the emitter E1 is thus transmitted to the terminal K' over the terminal E2 lying to the right of the emitter E1 in the forward-conducting condition (time span T3), but, during the shut-off (time interval T4), is conducted past the emitter E1 and over the emitter E2 lying to the left thereof, being conducted to the terminal K'. In the inhibiting condition of the thyristor, both switching transistors Tr1 and Tr2 are switched into their conductive condition, this meaning in FIG. 3 that both the inversion channel 19 and the inversion channel below the gate 25 are present. As a result thereof, high stability of the semiconductor switch against unintentional trigger operations is achieved.

In addition to the emitter structure E2, E1, E2 described above which contains the n-emitter elements 9a', 9b and 9a, FIG. 3 illustrates a further emitter structure E2, E1', E2' constructed analogous thereto which exhibits the semiconductor regions 9a, 9b' and 9a''. This emitter structure corresponds to the former in all significant circuit features. Thereby, the gates and electrodes thereof disposed above the boundary surface G1 are connected parallel to the corresponding parts of the emitter structure E2, E1, E2, namely, at the terminals 17, 26 and K'. Because of the analogy of the two emitter structures, a switching transistor Tr2 is provided at the right-hand edge of the n-emitter element 9a, the switching transistor Tr2 completely corresponding in terms of structure and manner of operation to the switching transistor Tr2 which comprises the elements 21, 22, 24, 25, 26 and 27. What is valid regarding the emitter structure E2, E1', E2' in FIG. 3 is that a load current component 32 directed towards E1' is transmitted during the time interval T3 over the emitter E2' to the terminal K' but, in contrast thereto, is transmitted to the terminal K' over the emitter E2 as a turn-off current 33 (broken lines) during the time interval T4.

Depending on the size of the load current to be conducted over the thyristor 1, a plurality of emitter structures comprising an emitter E1 and two emitters E2 flanking the structure can be provided, these being integrated on a shared semiconductor body. In particular, the emitter structures can be designed such that an emitter sequence E2, E1, E2, E2, E1, E2, etc, arises or the respective emitters E2 lying directly adjacent to one another can be replaced by a single emitter E2 which, corresponding to the emitter 9a in FIG. 3, then exhibits a transistor Tr1 as well as a transistor Tr2.

Different current gain factors $\alpha_{npn1}$ and $\alpha_{npn2}$ can also be achieved within the scope of the invention in that the sub-regions 29 of the p base 10 are not more strongly doped than the remaining p-emitter 10 but, instead, are provided with additional recombination centers. This occurs, for example, by irradiation of the p base 10 with an electron beam limited to the sub-regions 29 before generation of the n-emitter elements 9a. On the other hand, recombination centers can also be introduced into the sub-regions 29 in the form of gold or platinum atoms by diffusion or implantation. Increasing the plurality of recombination centers in the sub-regions 29 effects a reduction of the current gain factor $\alpha_{npn2}$ in comparison to the current gain factor $\alpha_{npn1}$. The same reduction can be achieved in that the penetration depth of the n-emitter elements 9a, 9a' and 9a'' into the p base 10 is selected smaller than the penetration depth of the n emitter elements 9b and 9b'.

Further, instead of the n-emitter, the p-emitter 12 can be subdivided into individual emitter portions which, together with the base layers 11 and 10, form respective three-layer structure having different current gain factors $\alpha_{pnp1}$ and $\alpha_{pnp2}$ and are provided with edge-side transistors Tr1 and Tr2. Such an embodiment of the invention can be explained with reference to FIG. 3 when the conductivity types of all semiconductor regions are replaced by the respectively opposite conductivity types, the designations of the terminals A and K' being mutually interchanged and the voltages supplied with respective opposite polarities.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. A semiconductor switching arrangement, comprising:

a thyristor including a first terminal for connection to a first potential; a second terminal and a control terminal for receiving an ignition voltage and a turn-off current;

a first switching transistor including a first terminal connected to said second terminal of said thyristor, a second terminal for connection to a second potential and a gate receiving a turn-on voltage for a first interval;

a second switching transistor for conducting the turn-off current, said second switching transistor including a first terminal connected to said control terminal, a second terminal connected to said second terminal of said first switching transistor, and a gate for receiving a turn-on voltage for a second interval;

said second transistor operable to be turned off during the application of an ignition voltage pulse following the end of said second interval to ignite said thyristor when the same is poled in the forward conducting direction and re-route the thyristor load current as turn-off current at the beginning of said second interval;

said first and second switching transistors each comprising a metal-insulator-semiconductor field effect transistor, and wherein said arrangment is further defined as comprising:

a boudary surface;

a mult-element first emitter of a first conductivity type, a first base of an opposite, second conductivity type adjacent said first emitter and including portions extending between said emitter elements to said boundary surface, a second base of the first conductivity type adjacent said first base, and a second emitter of said second conductivity type adjacent said second base, a first electrode carried on said second emitter, said multi-element first emitter comprising a first emitter element and second and third emitter elements flanking and spaced from said first emitter element, second and third electrodes respectively carried on said second and third emitter elements and electrically connected together thereby forming said second terminal of said first switching transistor, said gate of said first switching transistor carried insulated over adjacent edges of said first and second emitter elements and a first portion of said first base therebetween and thereby forming said first switching transistor, a fourth electrode carried on a portion of said first base and connected to said control terminal of said thyristor, said third emitter element including a zone of said second conductivity type at said boundary surface spaced from a second portion of said first base, and said gate of said second switching transistor carried insulated over and bridging the adjacent edges of said second portion of said first base, said zone and that portion of said third emitter element therebetween thereby forming said second switching transistor.

2. The semiconductor switching arrangement of claim 1, wherein:

said first conductivity type is n conductivity.

3. The semiconductor switching arrangement of claim 1, and further comprising:

a fourth emitter element spaced from said first emitter element with said second emitter element therebetween.

4. The semiconductor switching arrangement of claim 3, wherein:

said first emitter element and said first and second bases form a three-layer structure having a current gain factor $\alpha_1$ for the charge carriers emitted by said first emitter element; and said second emitter element and said first and second bases form a three-layer structure having a current gain factor $\alpha_2$ which is less than the current gain factor $\alpha_1$.

5. The semiconductor switching arrangement of claim 4, wherein:

said first emitter element is disposed in said first base at a greater penetration depth from said boundary surface then said second emitter element.

6. The semiconductor switching arrangement of claim 4, and further comprising:

three subregions in said first base surrounding said first, second and third emitter elements, respectively, the doping of said subregion surrounding said second and third emitter elements being greater than that of the subregion surrounding said first emitter element.

7. The semiconductor switching arrangement of claim 4, and further comprising:

three subregions in said first base surrounding said first, second and third emitter elements, respectively, the number of recombination centers of said subregions surrounding said second and third emitter elements being greater than that of the subregion surrounding said first emitter element.

* * * * *